(12) United States Patent
Seshimo et al.

(10) Patent No.: US 9,644,110 B2
(45) Date of Patent: May 9, 2017

(54) METHOD OF PRODUCING STRUCTURE CONTAINING PHASE-SEPARATED STRUCTURE AND METHOD OF FORMING TOP COAT FILM

(71) Applicant: Tokyo Ohka Kogyo Co., Ltd., Kawasaki-shi (JP)

(72) Inventors: Takehiro Seshimo, Kawasaki (JP); Takaya Maehashi, Kawasaki (JP); Takahiro Dazai, Kawasaki (JP); Yoshiyuki Utsumi, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 51 days.

(21) Appl. No.: 14/674,515

(22) Filed: Mar. 31, 2015

(65) Prior Publication Data
US 2015/0291832 A1 Oct. 15, 2015

(30) Foreign Application Priority Data

Apr. 9, 2014 (JP) ................................ 2014-080352

(51) Int. Cl.
| | | |
|---|---|---|
| *G03F 7/11* | (2006.01) | |
| *C09D 153/00* | (2006.01) | |
| *C09D 183/00* | (2006.01) | |
| *G03F 7/00* | (2006.01) | |
| *B82Y 40/00* | (2011.01) | |

(52) U.S. Cl.
CPC ......... *C09D 153/00* (2013.01); *C09D 183/00* (2013.01); *G03F 7/0002* (2013.01); *G03F 7/11* (2013.01); *B82Y 40/00* (2013.01)

(58) Field of Classification Search
CPC .......... G03F 7/0002; G03F 7/11; G03F 7/039; C09D 153/00; C09D 183/10
USPC ...... 430/270.1, 271.1, 273.1, 282.1; 524/549
See application file for complete search history.

(56) References Cited

U.S. PATENT DOCUMENTS

| | | | |
|---|---|---|---|
| 8,993,215 B2* | 3/2015 | Nishimaki ............. | G03F 7/091 430/270.1 |
| 9,169,421 B2* | 10/2015 | Matsumiya .......... | C09D 153/00 |
| 2005/0095435 A1* | 5/2005 | Tikart .................... | B32B 15/14 428/416 |

(Continued)

FOREIGN PATENT DOCUMENTS

JP  A-2008-036491  2/2008

OTHER PUBLICATIONS

William Hinsberg et al., Proceedings of SPIE, vol. 7637, 76370G-1, 2010.

*Primary Examiner* — Amanda C Walke
(74) *Attorney, Agent, or Firm* — Knobbe Martens Olson & Bear LLP

(57) ABSTRACT

A method of producing a structure containing a phase-separated structure, including forming a layer containing a block copolymer on a substrate; applying a top coat material to the layer containing the block copolymer to form a top coat film; and subjecting the layer including the block copolymer having the top coat film formed thereon to annealing treatment so as to conduct a phase separation of the layer, the top coat material including an organic solvent component and a polymeric compound containing a structural unit having either a dicarboxylic acid or a salt of a dicarboxylic acid, and the organic solvent component containing water and an alcohol having 3 or more carbon atoms.

20 Claims, 2 Drawing Sheets

(56) References Cited

U.S. PATENT DOCUMENTS

| | | | |
|---|---|---|---|
| 2010/0047710 A1* | 2/2010 | Yamagishi | C08F 220/28 430/270.1 |
| 2013/0154043 A1* | 6/2013 | Kato | C08G 73/026 257/432 |
| 2013/0344242 A1* | 12/2013 | Willson | B81C 1/00031 427/240 |
| 2014/0273457 A1* | 9/2014 | Su | G03F 7/40 438/692 |
| 2015/0034593 A1* | 2/2015 | Matsumiya | B82B 3/00 216/47 |
| 2015/0205207 A1* | 7/2015 | Seshimo | G03F 7/11 430/324 |

* cited by examiner

METHOD OF PRODUCING STRUCTURE CONTAINING PHASE-SEPARATED STRUCTURE AND METHOD OF FORMING TOP COAT FILM

TECHNICAL FIELD

The present invention relates to a method of producing a structure containing a phase-separated structure, and a method of forming a top coat film.

Priority is claimed on Japanese Patent Application No. 2014-080352, filed on Apr. 9, 2014, the content of which is incorporated herein by reference.

BACKGROUND ART

Recently, as further miniaturization of large scale integrated circuits (LSI) proceeds, a technology for processing a more delicate structure is demanded. In response to such demand, an attempt has already been started in which a fine pattern is formed using a phase-separated structure formed by self-assembly of a block copolymer having mutually incompatible blocks bonded together. (see for example, Patent Document 1).

For using a phase separation structure of a block copolymer, it is necessary to form a self-assembly nano structure through a microphase separation only in desired regions, and arrange the nano structure in a desired direction. To achieve a desired structure having desired position and orientation, graphoepitaxy to achieve desired phase-separated pattern by a guide pattern and chemical epitaxy to achieve desired phase-separated pattern by difference in the chemical state of the substrate are proposed (see, for example, Non-Patent Document 1).

DOCUMENTS OF RELATED ART

Patent Document

[Patent Document 1] Japanese Unexamined Patent Application, First Publication No. 2008-36491

Non-Patent Documents

[Non-Patent Document 1] Proceedings of SPIE (U.S.), vol. 7637, pp. 76370G-1 (2010)

SUMMARY OF THE INVENTION

Recently, a method in which a layer containing a block copolymer is formed and a top coat film is formed on the layer containing the block copolymer (hereinafter, sometimes referred to as "TC process") is attempted.

In TC process, in order to prevent from dissolving the block copolymer as a lower layer during formation of a top coat film, a solvent that does not dissolve a block copolymer such as water is employed as a solvent for a top coat material.

However, the surface of the layer containing a block copolymer has a high hydrophobicity. When solvent containing water is used, a top coat film is less likely to be formed. Therefore, a top coat material having excellent film formability is demanded.

The present invention takes the above circumstances into consideration, with an object of providing a method of forming a structure containing a phase-separated structure using a top coat material having excellent film formability.

A first aspect of the present invention is a method of producing a structure containing a phase-separated structure, including: a step in which a layer containing a block copolymer is formed on a substrate; a step in which a top coat material is applied to the layer containing the block copolymer to form a top coat film; and a step in which a step in which the layer including the block copolymer having the top coat film formed thereon is subjected to annealing treatment so as to conduct a phase separation of the layer; wherein the top coat material contains an organic solvent component (S) and a polymeric compound containing a structural unit having either a dicarboxylic acid or a salt of a dicarboxylic acid, and the organic solvent component (S) contains water and an alcohol having 3 or more carbon atoms.

A second aspect of the present invention is a method of forming a top coat film, including: a step in which a layer containing a block copolymer is formed on a substrate; and a step in which a top coat material is applied to the layer containing the block copolymer to form a top coat film; wherein the top coat material contains an organic solvent component (S) and a polymeric compound containing a structural unit having either a dicarboxylic acid or a salt of a dicarboxylic acid, and the organic solvent component (S) contains water and an alcohol having 3 or more carbon atoms.

According to the preset invention, there is provided a method of producing a phase-separated structure using a top coat material having excellent film formability.

MODE FOR CARRYING OUT THE INVENTION

Figure 1:
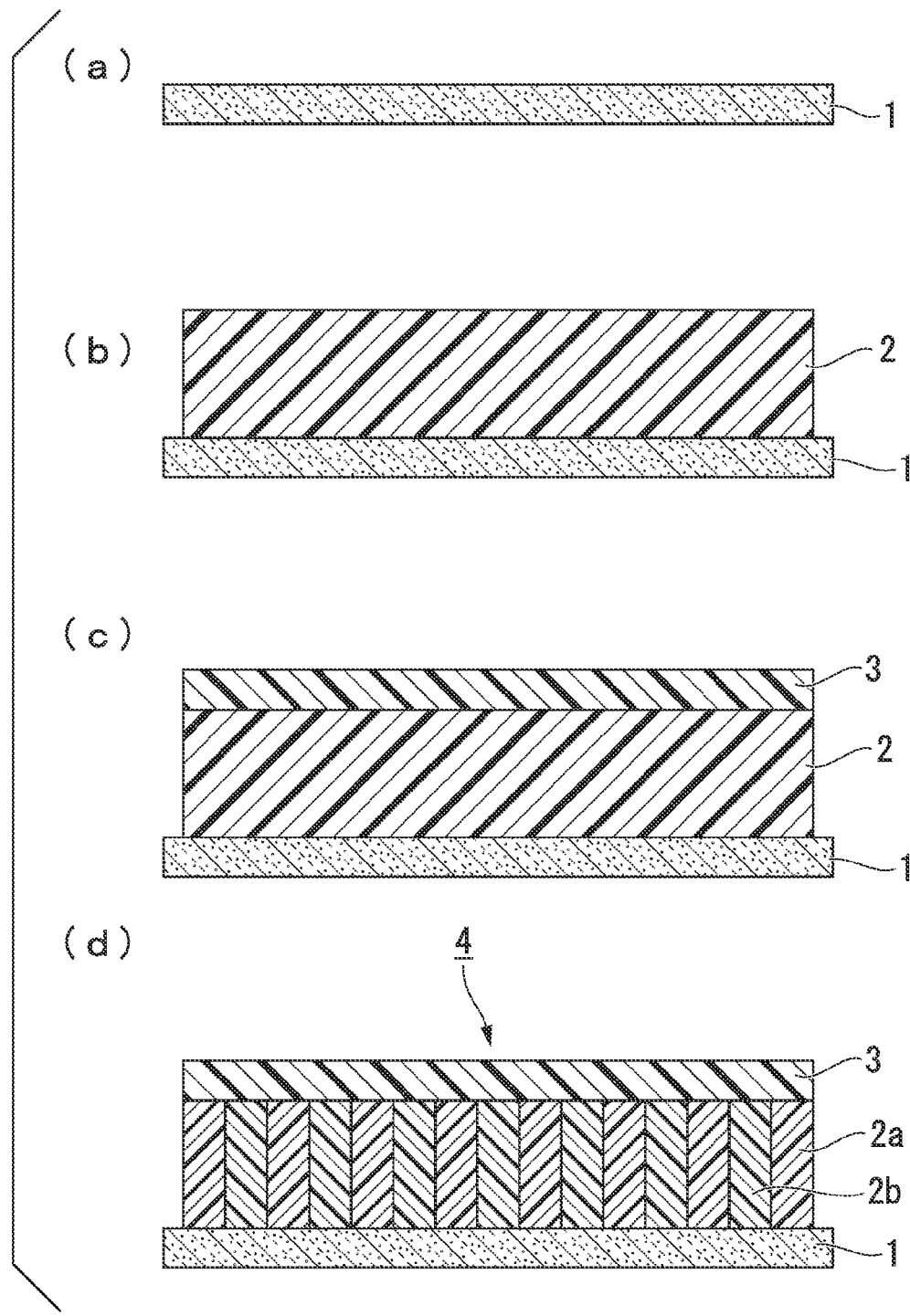
FIG. 1 is a schematic diagram showing an example of one embodiment of the method of producing a structure containing a phase-separated structure according to the present invention.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified. The same applies for the alkyl group within an alkoxy group.

The term "alkylene group" includes linear, branched or cyclic, divalent saturated hydrocarbon, unless otherwise specified.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with fluorine atom(s).

The term "structural unit" refers to a monomer unit that contributes to the formation of a polymeric compound (resin, polymer, copolymer).

The expression "may have a substituent" means that a case where a hydrogen atom (—H) is substituted with a monovalent group, or a case where a methylene (—CH$_2$—) group is substituted with a divalent group.

The term "exposure" is used as a general concept that includes irradiation with any form of radiation.

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2=CH-COOH$) has been substituted with an organic group.

The acrylate ester may have the hydrogen atom bonded to the carbon atom on the α-position substituted with a substituent. The substituent ($R^{\alpha 0}$) that substitutes the hydrogen atom bonded to the carbon atom on the α-position is an atom other than hydrogen or a group, and examples thereof include an alkyl group of 1 to 5 carbon atoms and a halogenated alkyl group of 1 to 5 carbon atoms. Further, an acrylate ester having the hydrogen atom bonded to the carbon atom on the α-position substituted with a substituent ($R^{\alpha 0}$) which has been substituted with a substituent containing an ester bond (e.g., an itaconic acid diester), or an acrylic acid having the hydrogen atom bonded to the carbon atom on the α-position substituted with a substituent ($R^{\alpha 0}$) which has been substituted with a hydroxyalkylgroup or a group in which the hydroxy group within a hydroxyalkyl group has been modified (e.g., α-hydroxyalkyl acrylate) can be mentioned as an acrylate ester having the hydrogen atom bonded to the carbon atom on the α-position substituted with a substituent. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from acrylamide" refers to a structural unit that is formed by the cleavage of the ethylenic double bond of acrylamide.

The acrylamide may have the hydrogen atom bonded to the carbon atom on the α-position substituted with a substituent, and may have either or both terminal hydrogen atoms on the amino group of acrylamide substituted with a substituent. A carbon atom on the α-position of an acrylamide refers to the carbon atom bonded to the carbonyl group, unless specified otherwise.

As the substituent which substitutes the hydrogen atom on the α-position of acrylamide, the same substituents as those described above for the substituent ($R^{\alpha 0}$) on the α-position of the aforementioned α-substituted acrylate ester can be mentioned.

A "structural unit derived from hydroxystyrene or a hydroxystyrene derivative" refers to a structural unit that is formed by the cleavage of the ethylenic double bond of hydroxystyrene or a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxy group has been substituted with an organic group and which may have the hydrogen atom on the α-position substituted with a substituent; and hydroxystyrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

As the substituent which substitutes the hydrogen atom on the α-position of hydroxystyrene, the same substituents as those described above for the substituent on the α-position of the aforementioned α-substituted acrylate ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include vinylbenzoic acid in which the hydrogen atom of the carboxy group has been substituted with an organic group and which may have the hydrogen atom on the α-position substituted with a substituent; and vinylbenzoic acid which has a substituent other than a hydroxy group or carboxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

A "styrene derivatives" includes compounds in which the hydrogen atom at the α-position of styrene has been substituted with another substituent such as an alkyl group or a halogenated alkyl group.

A "structural unit derived from styrene or a styrene derivative" refers to a structural unit that is formed by the cleavage of the ethylenic double bond of styrene or a styrene derivative.

As the alkyl group as a substituent on the α-position, a linear or branched alkyl group is preferable, and specific examples include alkyl groups of 1 to 5 carbon atoms, such as a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

<<Method of Producing Structure Containing Phase-Separated Structure>>

A first aspect of the present invention is a method of producing a structure containing a phase-separated structure, including: a step in which a layer containing a block copolymer is formed on a substrate; a step in which a top coat material is applied to the layer containing the block copolymer to form a top coat film; and a step in which a step in which the layer including the block copolymer having the top coat film formed thereon is subjected to annealing treatment so as to conduct a phase separation of the layer;

wherein the top coat material contains an organic solvent component (S) and a polymeric compound containing a structural unit having either a dicarboxylic acid or a salt of a dicarboxylic acid, and the organic solvent component (S) contains water and an alcohol having 3 or more carbon atoms.

[Step in which Layer Containing Block Copolymer is Formed on Substrate]

<Substrate>

A substrate 1 is set (FIG. 1(a)).

The substrate 1 is not particularly limited, as long as a solution containing a photosensitive resin or a block copolymer can be applied to the surface of the substrate. Examples of the substrate include a substrate constituted of an inorganic substance such as a metal (e.g., silicon, copper, chromium, iron or aluminum), glass, titanium oxide, silica or mica; and a substrate constituted of an organic substance such as an acrylic plate, polystyrene, cellulose, cellulose acetate or phenol resin.

Further, the size and the shape of the substrate 1 used in the present invention is not particularly limited. The substrate 1 does not necessarily have a smooth surface, and a substrate made of various materials and having various shapes can be appropriately selected for use. For example, a multitude of shapes can be used, such as a substrate having a curved surface, a plate having an uneven surface, and a thin sheet.

Further, on the surface of the substrate 1, an inorganic and/or organic film may be provided. As the inorganic film, an inorganic anti-reflection film (inorganic BARC) can be used. As the organic film, an organic anti-reflection film (organic BARC) can be used.

When a neutralization film (not shown) is formed on the substrate, the surface of the substrate 1 may be washed.

By washing the surface of the substrate, the later [neutralization film forming step] may be satisfactorily performed.

As the washing treatment, a conventional method may be used, and examples thereof include an oxygen plasma treatment, a hydrogen plasma treatment, an ozone oxidation treatment, an acid alkali treatment, and a chemical modification treatment. For example, the substrate is immersed in an acidic solution such as a sulfuric acid/hydrogen peroxide aqueous solution, followed by washing with water and drying. Thereafter, a layer containing a block copolymer can be formed on the surface of the substrate.

<Block Copolymer>

Block Copolymer

In the present invention, a block copolymer is a polymeric material in which plurality of constituent parts (i.e., block) in which only the structural units of the same type have been bonded, are bonded. In the present invention, a block copolymer containing an Si-containing block is preferably used. As the blocks constituting the block copolymer, 2 types of blocks may be used, or 3 or more types of blocks may be used. In the present invention, the plurality of blocks constituting the block copolymer is not particularly limited, as long as they are combinations capable of causing phase separation. However, it is preferable to use a combination of an Si-containing block and a non-Si-containing block, and it is preferable to use a combination of blocks which are mutually incompatible. Further, it is preferable to use a combination in which a phase of at least one block amongst the plurality of blocks constituting the block copolymer can be easily subjected to selective removal as compared to the phases of other blocks. As a combination of the blocks such that a phase of block can be easily subjected to selective removal, a block copolymer (in which one or more blocks have been mutually bonded) that has an etching selection ratio of 1 or more can be mentioned.

In the present invention, a "period of a block copolymer" refers to a period of a phase structure observed when a phase-separated structure is formed, and is a sum of the lengths of the phases which are mutually incompatible. The period of a block copolymer corresponds to the length of one molecule of the block copolymer.

The period of a block polymer is determined by intrinsic polymerization properties such as the polymerization degree N and the Flory-Huggins interaction parameter $\chi$. Specifically, the repulsive interaction between different blocks of the block copolymer becomes larger as the "$\chi N$" becomes larger. Therefore, when $\chi N>10$ (hereafter, referred to as "strong segregation limit"), there is a strong tendency for the phase separation to occur between different blocks in the block copolymer. At the strong segregation limit, the period of the block copolymer is approximately $N^{2/3}\chi^{1/6}$. That is, the period of the block copolymer is in proportion to the polymerization degree N which correlates with the molecular weight Mn and molecular weight ratio between different block. Therefore, by adjusting the composition and the total molecular weight of the block copolymer to be used, the period of the block copolymer can be easily adjusted.

[Si-Containing Block]

An Si-containing block which is preferably used in the present invention will be described.

An Si-containing block is not particularly limited as long as the block contains a structural unit containing an Si atom. For example, a block of a structural unit represented by general formula (a00-1) or (a00-2) shown below, a block of a structural unit of a siloxane or a derivative thereof or a block of a structural unit containing a polyhedral oligomeric silsesquioxane (POSS) can be mentioned.

[Chemical Formula 1]

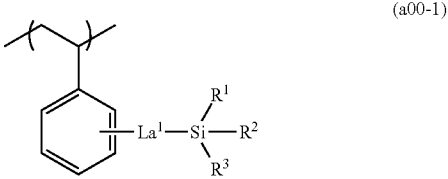

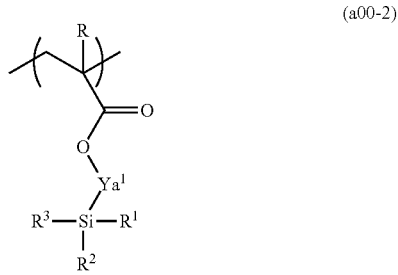

In the formulae (a00-1) and (a00-2), $La^1$ represents a single bond or a divalent linking group with or without a hetero atom; $R^1$, $R^2$ and $R^3$ each independently represents a hydrogen atom or an alkyl group of 1 to 5 carbon atoms; R represents an hydrogen atom, an alkyl group of 1 to 5 carbon atoms or a halogenated alkyl group of 1 to 5 carbon atoms; and $Ya^1$ represents a single bond or a divalent linking group.

In the formula (a00-1), $La^1$ represents a single bond or a divalent linking group with or without a hetero atom.

(Divalent Linking Group with or without a Hetero Atom for $La^1$)

With respect to a divalent linking group with or without a hetero atom, a hetero atom is an atom other than carbon and hydrogen, and examples thereof include an oxygen atom, a nitrogen atom, a sulfur atom and a halogen atom.

In the case where $La^1$ represents a divalent linking group containing a hetero atom, preferable examples of the linking group include —O—, —C(=O)—O—, —C(=O)—, —O—C(=O)—O—, —C(=O)—NH—, —NH—, —NH—C(=NH)— (wherein H may be substituted with a substituent such as an alkyl group or an acyl group), —S—, —S(=O)$_2$—, —S(=O)$_2$—O—, and a group represented by general formula —$Y^{21}$—O—$Y^{22}$—, —$Y^{21}$—O—, —$Y^{21}$—C(=O)—O—, —C(=O)—O—$Y^{21}$, —[$Y^{21}$—C(=O)—O]$_{m'}$—$Y^{22}$— or —$Y^{21}$—O—C(=O)—$Y^{22}$— [in the formulas, each of $Y^{21}$ and $Y^{22}$ independently represents a divalent hydrocarbon group with or without a substituent, O represents an oxygen atom, and m' represents an integer of 0 to 3].

When the divalent linking group containing a hetero atom represents —C(=O)—NH—, —NH—, or —NH—C(=NH)—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In formula —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_{m'}$—$Y^{22}$— or —$Y^{21}$—O—C(=O)—$Y^{22}$—, $Y^{21}$ and $Y^{22}$ each independently represents a divalent hydrocarbon group with or without a substituent. Examples of the divalent hydrocarbon group include the same groups as those described later as the "divalent hydrocarbon group with or without a substituent" in the explanation of a divalent linking group.

As $Y^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As $Y^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[$Y^{21}$—C(=O)—O]$_{m'}$—$Y^{22}$—, m' represents an integer of 0 to 3, preferably an integer of 0 to 2, more preferably 0 or 1, and particularly preferably 1. Namely, it is particularly desirable that the group represented by the formula —[$Y^{21}$—C(=O)—O]$_{m'}$—$Y^{22}$— is a group represented by general formula —$Y^{21}$—C(=O)—O—$Y^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

In $La^1$, as the hetero atom, an oxygen atom is preferred. In the present invention, it is preferable that $La^1$ represents an ester bond [—C(=O)—O—], an ether bond (—O—), a linear or branched alkylene group, a combination of these or a single bond.

In the formulae (a00-1) and (a00-2), $R^1$, $R^2$ and $R^3$ each independently represents a hydrogen atom or an alkyl group of 1 to 5 carbon atoms. Specific examples include a methyl group, an ethyl group, a propyl group, an isopropyl group, an n-butyl group, an isobutyl group, a tert-butyl group, a pentyl group, an isopentyl group, and a neopentyl group. In the present invention, each of $R^1$, $R^2$ and $R^3$ is preferably a methyl group.

In general formula (a00-2), as the alkyl group of 1 to 5 carbon atoms represented by R, a linear or branched alkyl group of 1 to 5 carbon atoms is preferable, and specific examples include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In formula (a00-2), $Ya^1$ represents a single bond or a divalent linking group. The divalent linking group is not particularly limited, and preferable examples thereof include a divalent hydrocarbon group with or without a substituent and a divalent linking group containing a hetero atom.

(Divalent Hydrocarbon Group with or without a Substituent for $Ya^1$)

The hydrocarbon group as a divalent linking group may be either an aliphatic hydrocarbon group or an aromatic hydrocarbon group.

An "aliphatic hydrocarbon group" refers to a hydrocarbon group that has no aromaticity. The aliphatic hydrocarbon group may be saturated or unsaturated. In general, the aliphatic hydrocarbon group is preferably saturated.

Examples of the aliphatic hydrocarbon group include a linear or branched aliphatic hydrocarbon group, and an aliphatic hydrocarbon group containing a ring in the structure thereof can be given.

The linear or branched aliphatic hydrocarbon group may or may not have a substituent. Examples of the substituent include a fluorine atom, a fluorinated alkyl group of 1 to 5 carbon atoms, and a carbonyl group.

As examples of the aliphatic hydrocarbon group containing a ring in the structure thereof, a cyclic aliphatic hydrocarbon group with or without a substituent containing a hetero atom in the ring structure thereof (a group in which two hydrogen atoms have been removed from an aliphatic hydrocarbon ring), a group in which the cyclic aliphatic hydrocarbon group is bonded to the terminal of a linear or branched aliphatic hydrocarbon group, and a group in which the cyclic aliphatic hydrocarbon group is interposed within a linear or branched aliphatic hydrocarbon group, can be given. As the linear or branched aliphatic hydrocarbon group, the same groups as those described above can be used.

The cyclic aliphatic hydrocarbon group preferably has 3 to 20 carbon atoms, and more preferably 3 to 12 carbon atoms.

The cyclic aliphatic hydrocarbon group may or may not have a substituent. Examples of the substituent include an alkyl group, an alkoxy group, an halogen atom, a halogenated alkyl group, a hydroxyl group and a carbonyl group.

The alkyl group as the substituent is preferably an alkyl group of 1 to 5 carbon atoms, and a methyl group, an ethyl group, a propyl group, an n-butyl group or a tert-butyl group is most desirable.

The alkoxy group as the substituent is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

In the cyclic aliphatic hydrocarbon group, part of the carbon atoms constituting the ring structure thereof may be substituted with a substituent containing a hetero atom. The substituent containing a hetero atom is preferably —O—, —C(=O)—O—, —S—, —S(=O)$_2$— or —S(=O)$_2$—O—.

The aromatic hydrocarbon group as the divalent hydrocarbon group preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which two hydrogen atoms have been removed from the aforementioned aromatic hydrocarbon ring (arylene group); and a group in which one hydrogen atom has been removed from the aforementioned aromatic hydrocarbon ring (aryl group) and one hydrogen atom has been substituted with an alkylene group (for example, a group in which one hydrogen atom has been removed from an aryl group within an arylalkyl group such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atoms, more preferably 1 or 2, and most preferably 1.

With respect to the aromatic hydrocarbon group, the hydrogen atom within the aromatic hydrocarbon group may be substituted with a substituent. For example, the hydrogen atom bonded to the aromatic ring within the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group of 1 to 5 carbon atoms, and a methyl group, an ethyl group, a propyl group, an n-butyl group or a tert-butyl group is most desirable.

As the alkoxy group, the halogen atom and the halogenated alkyl group for the substituent, the same groups as the aforementioned substituent groups for substituting a hydrogen atom within the cyclic aliphatic hydrocarbon group can be used.

(Divalent Linking Group Containing a Hetero Atom)

With respect to a divalent linking group containing a hetero atom, a hetero atom is an atom other than carbon and hydrogen, and examples thereof include an oxygen atom, a nitrogen atom, a sulfur atom and a halogen atom.

In the case where $Ya^1$ represents a divalent linking group containing a hetero atom, preferable examples of the linking group include —O—, —C(=O)—O—, —C(=O)—, —O—C(=O)—O—, —C(=O)—NH—, —NH—, —NH—C(=NH)— (wherein H may be substituted with a substituent such as an alkyl group or an acyl group), —S—, —S(=O)$_2$—, —S(=O)$_2$—O—, and a group represented by general formula —Y$^{21}$—O—Y$^{22}$—, —Y$^{21}$—O—, —Y$^{21}$—C(=O)—O—, —C(=O)—O—Y$^{21}$, —[Y$^{21}$—C(=O)—O]$_{m'}$—Y$^{22}$— or —Y$^{21}$—O—C(=O)—Y$^{22}$— [in the formulas, each of $Y^{21}$ and $Y^{22}$ independently represents a divalent hydrocarbon group with or without a substituent, O represents an oxygen atom, and m' represents an integer of 0 to 3].

When the divalent linking group containing a hetero atom represents —C(=O)—NH—, —NH—, or —NH—C(=NH)—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In formula —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m'}$—Y$^{22}$— or —Y$^{21}$—O—C(=O)—Y$^{22}$—, $Y^{21}$ and $Y^{22}$ each independently represents a divalent hydrocarbon group with or without a substituent. Examples of the divalent hydrocarbon group include the same groups as those described above as the "divalent hydrocarbon group with or without a substituent" in the explanation of the aforementioned divalent linking group.

As $Y^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As $Y^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[Y$^{21}$—C(=O)—O]$_{m'}$—Y$^{22}$—, m' represents an integer of 0 to 3, preferably an integer of 0 to 2, more preferably 0 or 1, and particularly preferably 1. Namely, it is particularly desirable that the group represented by the formula —[Y$^{21}$—C(=O)—O]$_{m'}$—Y$^{22}$— is a group represented by general formula —Y$^{21}$—C(=O)—O—Y$^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

In the present invention, $Ya^1$ preferably represents an ester bond [—C(=O)—O—], an ether bond (—O—), a linear or branched alkylene group, a combination of these, or a single bond.

Specific examples of the structural unit represented by formula (a00-1) or (a00-2) are shown below.

[Chemical Formula 2]

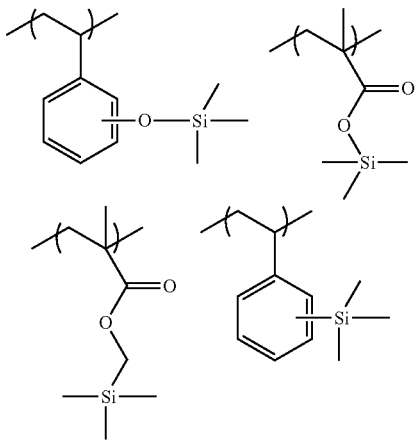

Examples of the block copolymers include a block copolymer in which a block of a structural unit containing no Si has been bonded to a block of a structural unit containing Si; a block copolymer in which a block of a structural unit derived from (α-substituted) acrylate ester has been bonded to a block of a structural unit containing Si; a block copolymer in which a block of a structural unit derived from (α-substituted) acrylic acid has been bonded to a block of a structural unit containing Si; a block copolymer in which a block of a structural unit containing Si has been bonded to a block of a structural unit derived from polyethylene oxide; a block copolymer in which a block of a structural unit containing Si has been bonded to a block of a structural unit derived from polypropylene oxide; a block copolymer in which a block of a structural unit containing Si has been bonded to a block of a structural unit derived from polylactate; a block copolymer in which a block of a structural unit containing an aromatic group has been bonded to a block of a structural unit derived from siloxane or a derivative thereof; a block copolymer in which a block of a structural unit containing a polyhedral oligomeric silsesquioxane structure has been bonded to a block of a structural unit derived from (α-substituted) acrylate ester; a block copolymer in which a block of a structural unit containing a polyhedral oligomeric silsesquioxane structure has been bonded to a block of a structural unit derived from (α-substituted) acrylic acid; and a block copolymer in which a block of a structural unit containing a polyhedral oligomeric silsesquioxane structure has been bonded to a block of a structural unit derived from siloxane or a derivative thereof.

In the present invention, the block copolymer preferably contains a structural unit having an aromatic group and a structural unit having an Si atom.

As the structural unit having an aromatic group, a structural unit having an aromatic group such as a phenyl group or an naphthyl group can be mentioned. In the present invention, a structural unit derived from a styrene or a derivative thereof is preferably used.

Examples of the styrene or the derivative thereof include styrene, α-methylstyrene, 2-methylstyrene, 3-methylstyrene, 4-methylstyrene, 4-t-butylstyrene, 4-n-octylstyrene, 2,4,6-trimethylstyrene, 4-methoxystyrene, 4-t-butoxystyrene, 4-hydroxystyrene, 4-nitrostyrene, 3-nitrostyrene, 4-chlorostyrene, 4-fluorostyrene, 4-acetoxyvinylstyrene, 4-vinylbenzylchloride, 1-vinylnaphthalene, 4-vinylbiphenyl, 1-vinyl-2-pyrolidone, 9-vinylanthracene, and vinylpyridine.

The (α-substituted) acrylic acid is a generic term that includes either or both of acrylic acid having a hydrogen atom bonded to the α-position and acrylic acid in which a hydrogen atom bonded to the α-position has been substituted with a substituent. As an example of such a substituent, an alkyl group of 1 to 5 carbon atoms can be given.

An example of an (α-substituted) acrylic acid includes acrylic acid and methacrylic acid.

The (α-substituted) acrylate ester is a generic term that includes either or both of acrylate ester having a hydrogen atom bonded to the α-position and acrylate ester in which a hydrogen atom bonded to the α-position has been substituted with a substituent. As an example of such a substituent, an alkyl group of 1 to 5 carbon atoms can be given.

Specific examples of the (α-substituted) acrylate ester include acrylate ester such as methyl acrylate, ethyl acrylate, propyl acrylate, n-butyl acrylate, t-butyl acrylate, cyclohexyl acrylate, octyl acrylate, nonyl acrylate, hydroxyethyl acrylate, hydroxypropyl acrylate, benzyl acrylate, anthracene acrylate, glycidyl acrylate, 3,4-epoxycyclohexylmethyl acrylate and trimethoxysilylpropyl acrylate; and methacrylate ester such as methyl methacrylate, ethyl methacrylate, propyl methacrylate, n-butyl methacrylate t-butyl methacrylate, cyclohexyl methacrylate, octyl methacrylate, nonyl methacrylate, hydroxyethyl methacrylate, hydroxypropyl methacrylate, benzyl methacrylate, anthracene methacrylate, glycidyl methacrylate, 3,4-epoxycyclohexylmethyl methacrylate and trimethoxysilylpropyl methacrylate.

Among these, methyl acrylate, ethyl acrylate, t-butyl acrylate, methyl methacrylate, ethyl methacrylate and t-butyl acrylate are preferable.

Examples of the siloxane and the derivative thereof include dimethylsiloxane, diethylsiloxane, diphenylsiloxane, and methylphenylsiloxane.

Examples of the alkylene oxide include ethylene oxide, propylene oxide, isopropylene oxide and butylene oxide.

As a structural unit containing a polyhedral oligomeric silsesquioxane (POSS), a structural unit represented by general formula (a0-1) shown below.

[Chemical Formula 3]

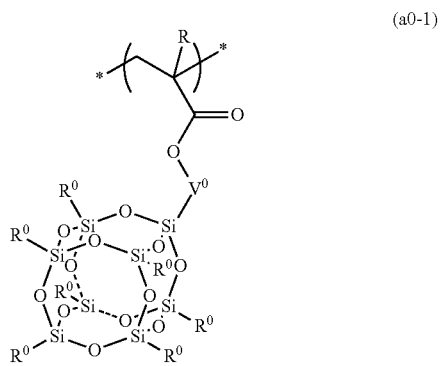

(a0-1)

In the formula, R represents a hydrogen atom, an alkyl group of 1 to 5 carbon atoms or a halogenated alkyl group of 1 to 5 carbon atoms; and $V^0$ represents a divalent hydrocarbon group with or without a substituent; and $R^0$ represents a monovalent hydrocarbon group with or without a substituent, wherein the plurality of $R^0$ may be the same or different from each other.

In general formula (a1-0), as the alkyl group of 1 to 5 carbon atoms represented by R, a linear or branched alkyl group of 1 to 5 carbon atoms is preferable, and specific examples include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In the formula (a0-1), the monovalent hydrocarbon group for $R^0$ preferably has 1 to 20 carbon atoms, more preferably 1 to 10, and still more preferably 1 to 8. Here, the number of carbon atoms within a substituent(s) described later is not included in the number of carbon atoms of the monovalent hydrocarbon group.

The monovalent hydrocarbon group for $R^0$ may be either an aliphatic hydrocarbon group or an aromatic hydrocarbon group, an aliphatic hydrocarbon group is preferable, and a monovalent saturated aliphatic hydrocarbon group (i.e., alkyl group) is more preferable.

As specific examples of the alkyl group, a chain-like aliphatic hydrocarbon group (e.g., a linear or branched alkyl group), and an aliphatic hydrocarbon group containing a ring in the structure thereof can be given.

The linear alkyl group preferably has 1 to 8 carbon atoms, more preferably 1 to 5, and most preferably 1 to 3. Specific examples include a methyl group, an ethyl group, an n-propyl group, an isopropyl group, an n-butyl group, an isobutyl group and an n-pentyl group. Among these, a methyl group, an ethyl group or an n-propyl group is preferable, and a methyl group, an ethyl group or an isobutyl group is preferable, an ethyl group or an isobutyl group is more preferable, and an ethyl group is particularly preferable.

The branched alkyl group preferably has 3 to 5 carbon atoms. Specific examples of such branched alkyl groups include an isopropyl group, an isobutyl group, a tert-butyl group, an isopentyl group and a neopentyl group, and an isopropyl group or a tert-butyl group is particularly desirable.

As examples of the hydrocarbon group containing a ring in the structure thereof, a cyclic aliphatic hydrocarbon group (a group in which one hydrogen atom has been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 8 carbon atoms, and more preferably 4 to 6 carbon atoms. The cyclic aliphatic hydrocarbon group may be either a polycyclic group or a monocyclic group. As the monocyclic group, a group in which one or more hydrogen atoms have been removed from a monocycloalkane of 3 to 6 carbon atoms is preferable. Examples of the monocycloalkane include cyclopentane and cyclohexane. As the polycyclic group, a group in which one or more hydrogen atoms have been removed from a polycycloalkane of 7 to 12 carbon atoms is preferable. Examples of the polycycloalkane include adamantane, norbornane, isobornane, tricyclodecane and tetracyclododecane.

The chain-like aliphatic hydrocarbon group may have a substituent. Examples of the substituent include a fluorine atom, a fluorinated alkyl group of 1 to 5 carbon atoms, and an oxygen atom (=O).

The cyclic aliphatic hydrocarbon group may have a substituent. Examples of the substituent include an alkyl group of 1 to 5 carbon atoms, a fluorine atom, a fluorinated alkyl group of 1 to 5 carbon atoms, and an oxygen atom (=O).

When the monovalent hydrocarbon group for $R^0$ is an aromatic hydrocarbon group, the aromatic hydrocarbon group is a monovalent hydrocarbon group having at least one aromatic ring.

The aromatic ring is not particularly limited, as long as it is a cyclic conjugated compound having $(4n+2)\pi$ electrons, and may be either monocyclic or polycyclic. The aromatic ring preferably has 5 to 30 carbon atoms, more preferably 5 to 20, still more preferably 6 to 15, and particularly preferably 6 to 12. Here, the number of carbon atoms within a substituent(s) described later is not included in the number of carbon atoms of the monovalent hydrocarbon group.

Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group include a group in which one hydrogen atom has been removed from the aforementioned aromatic hydrocarbon ring or aromatic hetero ring (aryl group or heteroaryl group); a group in which one hydrogen atom has been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group.

The alkylene group which is bonded to the aforementioned aryl group or heteroaryl group preferably has 1 to 4 carbon atoms, more preferably 1 or 2 carbon atoms, and particularly preferably 1 carbon atom.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

In the aforementioned formula (a0-1), the divalent hydrocarbon group for $V^0$ may be either an aliphatic hydrocarbon group or an aromatic hydrocarbon group. An "aliphatic hydrocarbon group" refers to a hydrocarbon group that has no aromaticity.

The aliphatic hydrocarbon group as the divalent hydrocarbon group for V⁰ may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable, and specific examples include a methylene group [—CH$_2$—], an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—].

As the branched aliphatic hydrocarbon group, a branched alkylene group is preferable, and specific examples include alkylalkylene groups, e.g., alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)CH$_2$CH$_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. As the alkyl group within the alkylalkylene group, a linear alkyl group of 1 to 5 carbon atoms is preferable.

As examples of the aliphatic hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of a linear or branched aliphatic hydrocarbon group, and a group in which the alicyclic hydrocarbon group is interposed within a linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a polycyclic group or a monocyclic group. As the monocyclic alicyclic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane.

As the polycyclic alicyclic hydrocarbon group, a group in which two hydrogen atoms have been removed from a polycycloalkane is preferable, and the polycycloalkane preferably has 7 to 12 carbon atoms. Examples of the polycycloalkane include adamantane, norbornane, isobornane, tricyclodecane and tetracyclododecane.

The aromatic hydrocarbon group is a hydrocarbon group having an aromatic ring.

The aromatic ring is not particularly limited, as long as it is a cyclic conjugated compound having (4n+2)π electrons, and may be either monocyclic or polycyclic. The aromatic ring preferably has 5 to 30 carbon atoms, more preferably 5 to 20, still more preferably 6 to 15, and particularly preferably 6 to 12. Here, the number of carbon atoms within a substituent(s) described later is not included in the number of carbon atoms of the aromatic hydrocarbon group.

Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group include a group in which two hydrogen atoms have been removed from the aforementioned aromatic hydrocarbon ring or aromatic hetero ring (arylene group or heteroarylene group); a group in which two hydrogen atoms have been removed from an aromatic compound having two or more aromatic rings (biphenyl, fluorene or the like); and a group in which one hydrogen atom has been removed from the aforementioned aromatic hydrocarbon ring or aromatic hetero ring and one hydrogen atom thereof has been substituted with an alkylene group (a group in which one hydrogen atom has been removed from the aryl group within the aforementioned arylalkyl group such as a benzyl group, a phenethyl group, a 1-naphthylmethyl group, a 2-naphthylmethyl group, a 1-naphthylethyl group, or a 2-naphthylethyl group, or a heteroarylalkyl group).

The alkylene group which is bonded to the aforementioned aryl group or heteroaryl group preferably has 1 to 4 carbon atoms, more preferably 1 or 2 carbon atoms, and particularly preferably 1 carbon atom.

Specific examples of structural units represented by the general formula (a0-1) are shown below. In the formulas shown below, R$^α$ represents a hydrogen atom, a methyl group or a trifluoromethyl group.

[Chemical Formula 4]

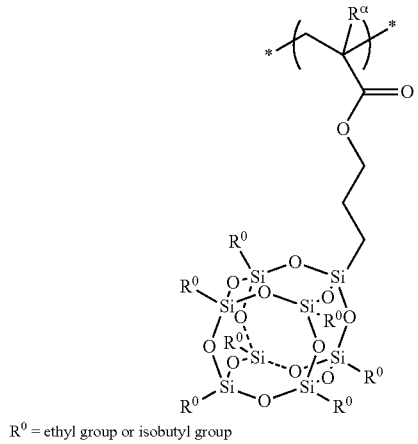

R⁰ = ethyl group or isobutyl group

In the present invention, the molar ratio of the structural unit containing no Si atom and the structural unit containing an Si atom is preferably 50:50 to 70:30, and more preferably 60:40 to 65:35.

When the ratio of the structural unit containing no Si atom and the structural unit containing an Si atom is within the above-mentioned range, a cylinder phase-separated structure arranged in a perpendicular direction of the surface of the substrate can be obtained.

As such a block copolymer, a block copolymer containing a block of styrene and a Si-containing block, a block copolymer containing a block of a structural unit containing a polyhedral oligomeric silsesquioxane (POSS) and a block of acrylic acid, and a block copolymer containing a block of a structural unit containing a polyhedral oligomeric silsesquioxane (POSS) and a block of methyl acrylate.

The weight average molecular weight (Mw) (the polystyrene equivalent value determined by gel permeation chromatography) of each polymer constituting the block copolymer is not particularly limited as long as it is large enough to cause phase separation. The weight average molecular weight is preferably 5,000 to 500,000, more preferably 5,000 to 400,000, and still more preferably 5,000 to 300,000.

The polydispersity (Mw/Mn) of the block copolymer is preferably 1.0 to 3.0, more preferably 1.0 to 1.5, and still more preferably 1.0 to 1.3. Here, Mn is the number average molecular weight.

If desired, other miscible additives can also be added to the composition containing a block copolymer. Examples of such miscible additives include additive resins for improving the performance of the layer composed of the neutralization film, surfactants for improving the applicability, dissolution inhibitors, plasticizers, stabilizers, colorants, halation prevention agents, dyes, sensitizers, base amplifiers and basic compound.

Organic Solvent

The composition containing a block copolymer can be prepared by dissolving the aforementioned block copolymer in an organic solvent. The organic solvent may be any organic solvent which can dissolve the respective components to give a uniform solution, and one or more kinds of any organic solvent can be appropriately selected from those which have been conventionally known as solvents for a film composition containing a resin as a main component.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME), cyclohexanone and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3. Alternatively, when PGME and cyclohexanone is mixed as the polar solvent, the PGMEA:(PGME+cyclohexanone) weight ratio is preferably from 1:9 to 9:1, more preferably from 2:8 to 8:2, and still more preferably 3:7 to 7:3.

Further, as the organic solvent in the component containing a block copolymer, a mixed solvent of γ-butyrolactone with PGMEA, EL or the aforementioned mixed solvent of PGMEA with a polar solvent, is also preferable. The mixing ratio (former:latter) of such a mixed solvent is preferably from 70:30 to 95:5.

There are no particular limitations on the amount used of the organic solvent in the composition containing the block copolymer, which may be adjusted appropriately to produce a concentration that enables application of the solution in accordance with the desired thickness of the formed film. In general, the organic solvent is used in an amount that yields a solid content of the block copolymer that is within a range from 0.2 to 70% by weight, and preferably from 0.2 to 50% by weight.

Hereafter, among the blocks constituting the block copolymer, a block which is not selectively removed is referred to as "block $P_B$" (2b in FIG. 1), and a block to be selectively removed is referred to as "block $P_A$" (2a in FIG. 1). For example, after the phase separation of a layer containing a PS-Si-containing block copolymer, by subjecting the layer to an oxygen plasma treatment or a hydrogen plasma treatment, the phase of Si-containing block is selectively removed. In such a case, PS is the block $P_B$ and Si-containing block is the block $P_A$.

In the present invention, the shape and size of the phase to be selectively removed (i.e., the phase of block $P_A$) is determined by the volume fraction of the respective blocks constituting the block copolymer and the molecular weight of the block copolymer. For example, by making the volume fraction of the block $P_A$ within the block copolymer relatively small, a cylinder structure in which the phase of the block $P_A$ polymer is present within the phase of the block $P_B$ in the form of a cylinder can be formed. On the other hand, by making the volume fraction of the block $P_A$ within the block copolymer about the same as that of the block $P_B$, a lamellar structure in which the phase of the block $P_B$ and the phase of the block $P_A$ are alternately laminated can be formed. Further, by increasing the molecular weight of the block copolymer, the size of each phase can be increased.

[Step in which Top Coat Material is Applied to Layer Containing Block Copolymer to Form Top Coat Film]

In the present invention, after the [Step in which layer containing block copolymer is formed on substrate], a step in which a top coat material is applied to a layer containing a block copolymer to form a top coat film (hereinafter, sometimes referred to as "top coat film forming step") is employed.

In the top coat film forming step, as shown in FIG. 1(c), a top coat material is applied to a layer 2 including a block copolymer to form a top coat film 3.

In the top coat film forming step, a top coat material that contains an organic solvent component (S) and a polymeric compound containing a structural unit having either a dicarboxylic acid or a salt of a dicarboxylic acid is applied to the layer to form a top coat film.

By forming a top coat film 3 using the top coat material on the layer 2 containing a block copolymer, the surface condition of the layer can be controlled, and phase separation can be stably conducted.

In the present invention, the formation of top coat film 3 can be conducted by applying the top coat material to the layer 2 containing a block copolymer using a spinner or the like. After the application, bake treatment may be conducted. The heat temperature is preferably 80 to 280° C., and the heating time is preferably 10 to 600 seconds.

The thickness of the top coat film 3 formed on the layer 2 containing a block copolymer is preferably 2 to 500 nm, more preferably 5 to 200 nm, and still more preferably 10 to 100 nm. By ensuring that the thickness of the topcoat film 3 is within the aforementioned range, it is possible to block the adverse effect from the external environment satisfactorily, and phase separation is likely to be proceeded.

As the topcoat material, the topcoat material described later can be applied. In the present invention, the top coat material contains an organic solvent component (S) and a polymeric compound containing a structural unit having either a dicarboxylic acid or a salt of a dicarboxylic acid, and the organic solvent component (S) contains water and an alcohol having 3 or more carbon atoms.

<<Top Coat Material>>

A top coat material that is preferably used in a method of producing a structure containing a phase-separated structure of the present invention will be described.

In the present invention, the top coat material contains an organic solvent component (S) and a polymeric compound containing a structural unit (Tc1) having either a dicarboxylic acid or a salt of a dicarboxylic acid, and the organic solvent component (S) contains water and an alcohol having 3 or more carbon atoms (hereinafter, sometimes referred to as "top coat material (1)").

The top coat material of the present invention may be a top coat material (hereafter, sometimes referred to as "top coat material (2)") that includes a polymeric compound containing a structural unit (Tc1) having either a dicarboxylic acid or a salt of a dicarboxylic acid and a structural unit (Tc2) that controls a surface energy of the layer containing a block copolymer.

The top coat material may be a top coat material that includes: a polymeric compound containing a structural unit (Tc1) having either a dicarboxylic acid or a salt of a dicarboxylic acid; a surface energy control agent that controls a surface energy of the layer containing a block copolymer; and an organic solvent component (S).

<Top Coat Material (1)>
(Polymeric Compound)

A polymeric compound used in the top coat material (1) contains a structural unit (Tc1) having either a dicarboxylic acid or a salt of a dicarboxylic acid.

By including the structural unit (Tc1), the surface energy of the layer containing the block copolymer can be maintained in an appropriate level during the phase separation.

As the "structural units having either a dicarboxylic acid or a salt of a dicarboxylic acid", structural units represented by chemical formulae shown below can be mentioned.

The structural unit represented by chemical formula (Tc1-1) is a structural unit that exhibits increased polarity in the presence of water or a basic component. The structural unit represented by chemical formula (Tc1-2) or (Tc1-3) is a structural unit that exhibits decreased polarity by heating.

[Chemical Formula 5]

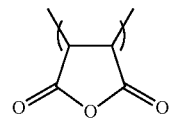

(Tc1-1)

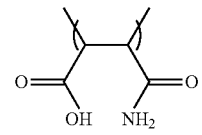

(Tc1-2)

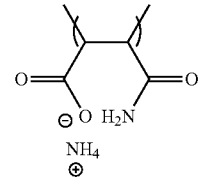

(Tc1-3)

As the structural unit (Tc1) contained in the polymeric compound, 1 type of structural unit may be used, or 2 or more types may be used.

The type of the structural unit (Tc1) selected from the group consisting of structural units represented by general formulae (Tc1-1) to (Tc1-3) can be appropriately determined, taking into consideration the type of the block copolymer or the level of the surface energy of the layer of containing the block copolymer.

As the structural unit (Tc1), it is preferable to use the structural unit represented by the aforementioned chemical formula (Tc1-1), or the structural unit represented by the aforementioned chemical formula (Tc1-2).

In the polymeric compound, the amount of the structural unit (Tc1) based on the combined total of all structural units constituting the polymeric compound is preferably 10 to 90 mol %, more preferably 30 to 80 mol %, and still more preferably 40 to 80 mol %.

When the amount of the structural unit (Tc1) is within the aforementioned range, the surface energy of the layer containing the block copolymer can be easily maintained in an appropriate level during the phase separation.

In the present invention, a top coat material contains an organic solvent component (S).

<Organic Solvent Component (S)>

In the present invention, an organic solvent component (hereafter, sometimes referred to as "component (S)") contains water and an alcohol having 3 or more carbon atoms.

As an alcohol having 3 or more carbon atoms, a water-soluble alcohol is preferred. More specifically, isopropyl alcohol, propylene glycol monomethyl ether, 3-methoxy-1-propanol, 3-methoxy-3-methylbutanol and t-butanol can be mentioned.

In the present invention, one or more kinds of any organic solvent components can be appropriately selected from those as described above. In the present invention, as the alcohol having 3 or more carbon atoms, isopropyl alcohol is preferred.

In the present invention, mixing ratio of the mixed solvent containing water and an alcohol having 3 or more carbon atoms can be appropriately determined.

Specifically, a mixed solvent containing water and isopropyl alcohol, and a mixed solvent containing water, propylene glycol monomethyl ether and isopropyl alcohol can be mentioned.

The mixing ratio of a mixed solvent can be appropriately adjusted. For example, when isopropyl alcohol is used as an alcohol having 3 or more carbon atoms, the mixing ratio (ratio by weight) of isopropyl alcohol to water is preferably 0.1 to 5, more preferably 0.2 to 4 and particularly preferably 0.3 to 3.5.

When a mixed solvent containing water, propylene glycol monomethyl ether and isopropyl alcohol, a mixed solvent having a mixing ratio of water:propylene glycol monomethyl ether:isopropyl alcohol=1:1:1 can be used.

The polymeric compound used in the top coat material (1) may contain a structural unit other than the structural unit (Tc1).

Examples of the structural unit other than the structural unit (Tc1) include a structural unit (Tc2) that controls the surface energy of the layer containing the block copolymer, a structural unit (Tc3) that controls the glass transition temperature (Tag).

Structural Unit (Tc2)

A structural unit (Tc2) is a structural unit that controls a surface energy of the layer containing a block copolymer.

By including the structural unit (Tc2), the surface energy of the layer containing the block copolymer can be controlled in an appropriate level during the phase separation.

As the structural unit (Tc2), any structural units can be used, as long as it controls polarity of the polymeric compound containing the structural unit (Tc1). It is preferable to include at least one structural unit selected from the group consisting of a structural unit represented by general formula (Tc2-1) shown below, a structural unit represented by general formula (Tc2-2) shown below and a structural unit represented by general formula (Tc2-3) shown below.

[Chemical Formula 6]

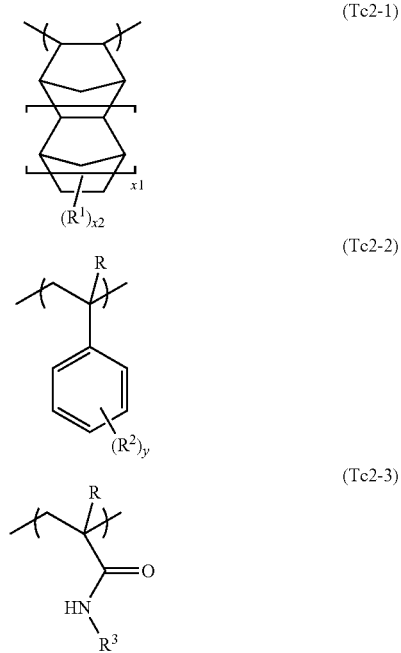

In the formulae, x1 represents 0 or 1; $R^1$ represents a fluorine atom or a hydrocarbon group with or without a fluorine atom or an oxygen atom; x2 represents an integer of 0 to 4; R represents a hydrogen atom, an alkyl group of 1 to 5 carbon atoms or a halogenated alkyl group of 1 to 5 carbon atoms; and the plurality of R may be the same or different from each other; $R^2$ represents a fluorine atom or a hydrocarbon group with or without a fluorine atom or an oxygen atom; y represents an integer of 0 to 3; $R^3$ represents a hydrocarbon group with or without a substituent; wherein the substituent for $R^3$ is a fluorine atom or a hydrocarbon group with or without a fluorine atom or an oxygen atom.

In general formula (Tc2-1) above, x1 represents 0 or 1.

x2 represents an integer of 0 to 4, is preferably an integer of 0 to 2, is more preferably either 0 or 1, and is most preferably 1.

In the formula (Tc2-1), $R^1$ represents a fluorine atom or a hydrocarbon group with or without a fluorine atom or an oxygen atom. The monovalent hydrocarbon group for $R^1$ may be either an aliphatic hydrocarbon group or an aromatic hydrocarbon group, an aliphatic hydrocarbon group is preferable, and a monovalent saturated aliphatic hydrocarbon group (i.e., alkyl group) is more preferable.

As specific examples of the alkyl group, a chain-like aliphatic hydrocarbon group (e.g., a linear or branched alkyl group), and an aliphatic hydrocarbon group containing a ring in the structure thereof can be given.

The linear alkyl group preferably has 1 to 8 carbon atoms, more preferably 1 to 5, and most preferably 1 to 3. Specific examples include a methyl group, an ethyl group, an n-propyl group, an n-butyl group and an n-pentyl group. Among these, a methyl group, an ethyl group or an n-propyl group is preferable, and a methyl group or an ethyl group is more preferable.

The branched alkyl group preferably has 3 to 10 carbon atoms, more preferably 3 to 8, and most preferably 3 to 6.

As examples of the hydrocarbon group containing a ring in the structure thereof, a cyclic aliphatic hydrocarbon group (a group in which one hydrogen atom has been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 8 carbon atoms, and more preferably 4 to 6 carbon atoms. The cyclic aliphatic hydrocarbon group may be either a polycyclic group or a monocyclic group. As the monocyclic group, a group in which one or more hydrogen atoms have been removed from a monocycloalkane of 3 to 6 carbon atoms is preferable. Examples of the monocycloalkane include cyclopentane and cyclohexane. As the polycyclic group, a group in which one or more hydrogen atoms have been removed from a polycycloalkane of 7 to 12 carbon atoms is preferable. Examples of the polycycloalkane include adamantane, norbornane, isobornane, tricyclodecane and tetracyclododecane.

The chain-like aliphatic hydrocarbon group and the cyclic aliphatic hydrocarbon group may contain a fluorine atom or an oxygen atom. In other words, the hydrogen atom in the aliphatic hydrocarbon group may be substituted with a fluorine atom. The methylene group (—$CH_2$—) in the aliphatic hydrocarbon group may be substituted with an oxygen atom (—O—) or a carbonyl group (—C(=O)—).

When the monovalent hydrocarbon group for $R^1$ is an aromatic hydrocarbon group, the aromatic hydrocarbon group is a monovalent hydrocarbon group having at least one aromatic ring.

The aromatic ring is not particularly limited, as long as it is a cyclic conjugated compound having (4n+2)π electrons, and may be either monocyclic or polycyclic. The aromatic ring preferably has 5 to 30 carbon atoms, more preferably 5 to 20, still more preferably 6 to 15, and particularly preferably 6 to 12. Here, the number of carbon atoms within a substituent(s) described later is not included in the number of carbon atoms of the monovalent hydrocarbon group.

Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group include a group in which one hydrogen atom has been removed from the aforementioned aromatic hydrocarbon ring or aromatic hetero ring (aryl group or heteroaryl group); a group in which one hydrogen atom has been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group.

The alkylene group which is bonded to the aforementioned aryl group or heteroaryl group preferably has 1 to 4 carbon atoms, more preferably 1 or 2 carbon atoms, and particularly preferably 1 carbon atom.

The aromatic hydrocarbon group may contain a fluorine atom or an oxygen atom. In other words, the hydrogen atom in the aromatic hydrocarbon group may be substituted with a fluorine atom. The methylene group (—CH$_2$—) in the aromatic hydrocarbon group may be substituted with an oxygen atom (—O—) or a carbonyl group (—C(=O)—).

In the aforementioned general formulae (Tc2-2) and (Tc2-3), R represents a hydrogen atom, an alkyl group of 1 to 5 carbon atoms or a halogenated alkyl group of 1 to 5 carbon atoms. Here, the plurality of the R group may be the same or different from each other.

As the alkyl group for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In general formula (Tc2-2), $R^2$ is the same as defined for $R^1$ in general formula (Tc2-1).

y represents an integer of 0 to 3, is preferably an integer of 0 to 2, is more preferably either 1 or 2, and is most preferably 1.

In general formula (Tc2-3), $R^3$ represents a hydrocarbon group with or without a substituent.

The hydrocarbon group for $R^3$ is the same hydrocarbon group as those described above for $R^1$ in general formula (Tc2-1).

Examples of the substituent for $R^3$ include a fluorine atom or a hydrocarbon group with or without a fluorine atom or an oxygen atom, and are the same groups as those described above for $R^1$ in the aforementioned formula (Tc2-1).

Specific examples of structural units represented by the general formula (Tc2-1) are shown below.

In the formula, $R^{11}$ represents a hydrogen atom or a hydrocarbon group with or without a fluorine atom.

The hydrocarbon group for $R^{11}$ is the same hydrocarbon group as those described above for $R^1$ in general formula (Tc2-1). In the chemical formula, the wavy line refers to both "wedge bond" and "dashed line bond".

[Chemical Formula 7]

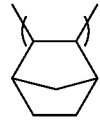

(Tc2-1-1)

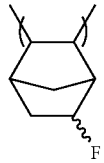

(Tc2-1-2)

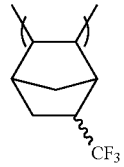

(Tc2-1-3)

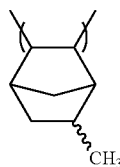

(Tc2-1-4)

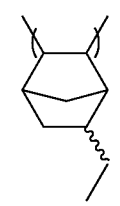

(Tc2-1-5)

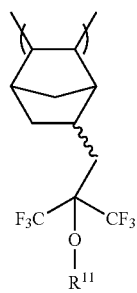

(Tc2-1-6)

(Tc2-1-7)

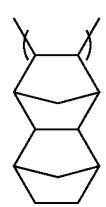

(Tc2-1-8)

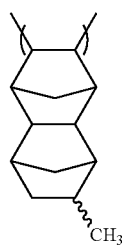

(Tc2-1-9)

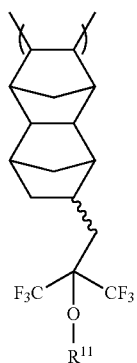

Specific examples of structural units represented by the general formula (Tc2-2) are shown below. In the formulas shown below, $R^\alpha$ represents a hydrogen atom, a methyl group or a trifluoromethyl group.

In the formula, $R^{12}$ represents a hydrogen atom or a hydrocarbon group with or without a fluorine atom.

The hydrocarbon group for $R^{12}$ is the same hydrocarbon group as those described above for $R^1$ in general formula (Tc2-1).

[Chemical Formula 8]

(Tc2-2-1)

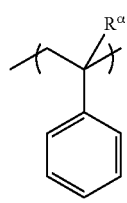

(Tc2-2-2)

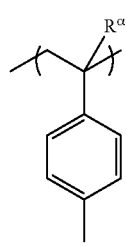

(Tc2-2-3)

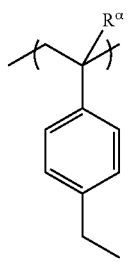

(Tc2-2-4)

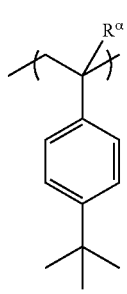

(Tc2-2-5)

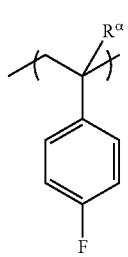

(Tc2-2-6)

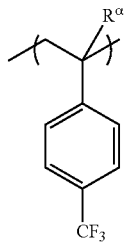

(Tc2-2-7)

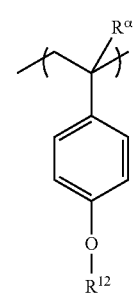

(Tc2-2-8)

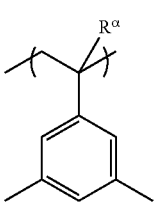

(Tc2-2-9)

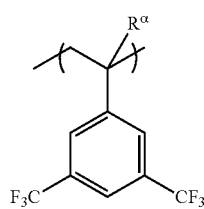

(Tc2-2-10)

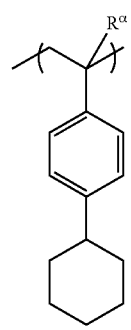

Specific examples of structural units represented by the general formula (Tc2-3) are shown below. In the formulas shown below, $R^\alpha$ represents a hydrogen atom, a methyl group or a trifluoromethyl group.

In the formula, $R^{13}$ represents a hydrogen atom or a hydrocarbon group with or without a fluorine atom.

The hydrocarbon group for $R^{13}$ is the same hydrocarbon group as those described above for $R^1$ in general formula (Tc2-1).

[Chemical Formula 9]

(Tc2-3-1)

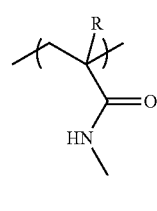

(Tc2-3-2)

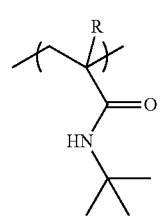

(Tc2-3-3)

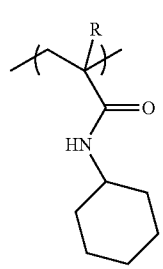

(Tc2-3-4)

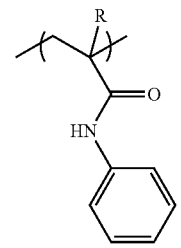

(Tc2-3-5)

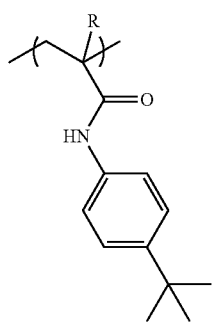

(Tc2-3-6)

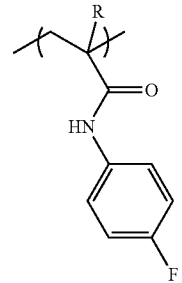

(Tc2-3-7)

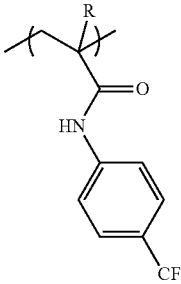

(Tc2-3-8)

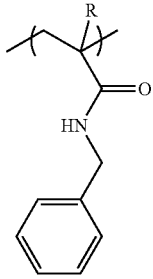

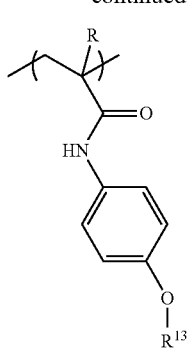

(Tc2-3-9)

As the structural unit (T2) contained in the polymeric compound, 1 type of structural unit may be used, or 2 or more types may be used.

As the structural unit (Tc2), it is preferable to include at least one structural unit selected from the group consisting of a structural unit represented by the general formula (Tc2-1), a structural unit represented by the general formula (Tc2-2) and a structural unit represented by the general formula (Tc2-3), and it is more preferable to include at least one structural unit selected from the group consisting of a structural unit represented by the general formula (Tc2-1) and a structural unit represented by the general formula (Tc2-2).

In the polymeric compound, the amount of the structural unit (Tc2) based on the combined total of all structural units constituting the polymeric compound is preferably 10 to 90 mol %, more preferably 20 to 70 mol %, and still more preferably 20 to 60 mol %.

When the amount of the structural unit (Tc2) is within the aforementioned range, the surface energy of the layer containing the block copolymer can be easily controlled.

The polymeric compound used in the top coat material (2) may contain a structural unit other than the structural units (Tc1) and (Tc2).

Examples of the structural unit other than the structural unit (Tc1) or (Tc2) include a structural unit (Tc3) that controls the glass transition temperature (Tag).

In the top coat material (2), as the polymeric compound containing the structural unit (Tc1) or (Tc2), one type of polymeric compound may be used alone, or two or more types of polymeric compounds may be used in combination.

The polymeric compound used in the top coat material (2) is a polymer containing at least the structural unit (Tc1) and the structural unit (Tc2).

More specifically, preferable examples of the copolymer include a copolymer containing a repeating structure of a structural unit represented by general formula (Tc1-2) a structural unit represented by general formula (Tc2-1); a copolymer containing a repeating structure of a structural unit represented by general formula (Tc1-2) and a structural unit represented by general formula (Tc2-2); a copolymer containing a repeating structure of a structural unit represented by general formula (Tc1-2) and a structural unit represented by general formula (Tc2-3); a copolymer containing a repeating structure of a structural unit represented by general formula (Tc1-2), a structural unit represented by general formula (Tc2-1) and a structural unit represented by general formula (Tc2-2); a copolymer containing a repeating structure of a structural unit represented by general formula (Tc1-2), a structural unit represented by general formula (Tc2-1) and a structural unit represented by general formula (Tc2-3); a copolymer containing a repeating structure of a structural unit represented by general formula (Tc1-2), a structural unit represented by general formula (Tc2-2) and a structural unit represented by general formula (Tc2-3); and a copolymer containing a repeating structure of a structural unit represented by general formula (Tc1-1), a structural unit represented by general formula (Tc2-1) and a structural unit represented by general formula (Tc2-2). Among these copolymers, it is preferable to include a copolymer containing a repeating structure of a structural unit represented by general formula (Tc1-1), a structural unit represented by general formula (Tc2-1) and structural unit represented by general formula (Tc2-2).

Specific examples of polymeric compounds used in the top coat material (2) are shown below.

In the formulae, $R^1$, $R^2$, $R^3$ and y are respectively the same as defined for $R^1$, $R^2$, $R^3$ and y in the formulae (Tc2-1) to (Tc2-3).

In the formulae, $R^{1a}$ and $R^{1b}$ are the same as defined for $R^1$ in the formula (Tc2-1).

$R^{2a}$ and $R^{2b}$ are the same as defined for $R^2$ in the formula (Tc2-2).

$y_1$ and $y_2$ are the same as defined for y in the formula (Tc2-2).

$R^{3a}$ and $R^{3b}$ are the same as defined for $R^3$ in the formula (Tc2-3).

$R^\alpha$ is the same as defined above.

[Chemical Formula 10]

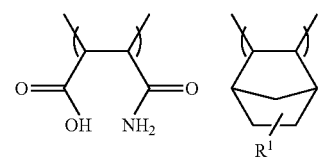
(TC1)

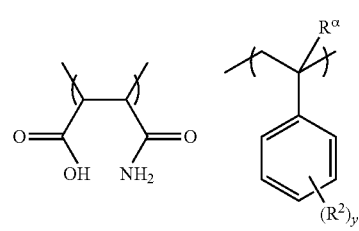
(TC2)

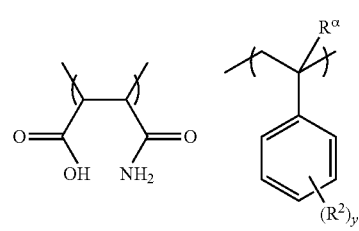
(TC3)

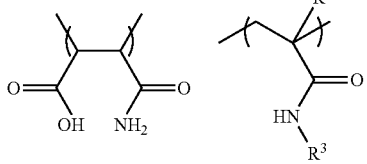

[Chemical Formula 11]

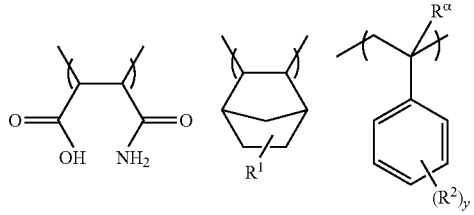
(TC4)

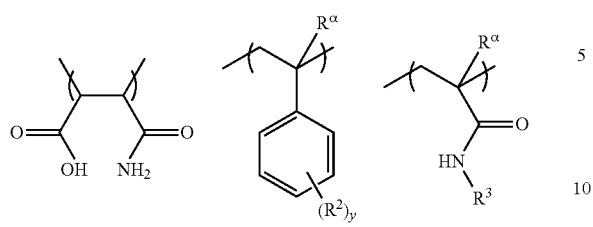
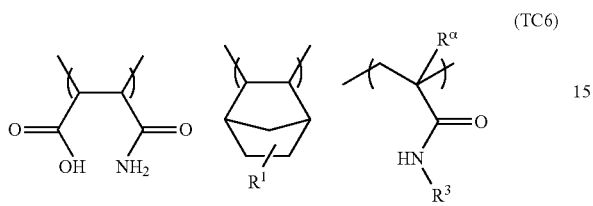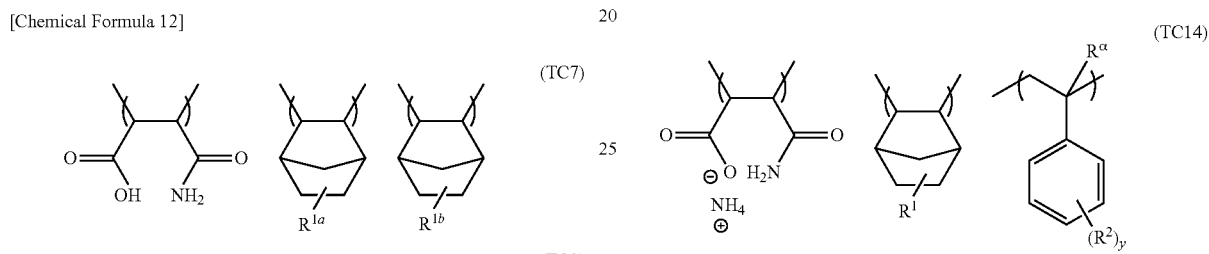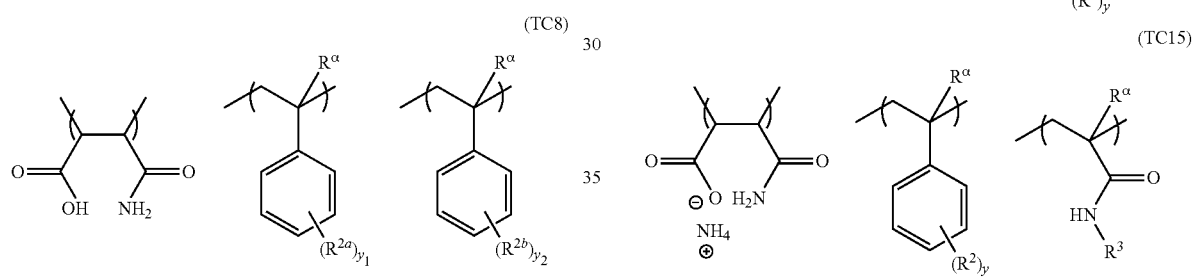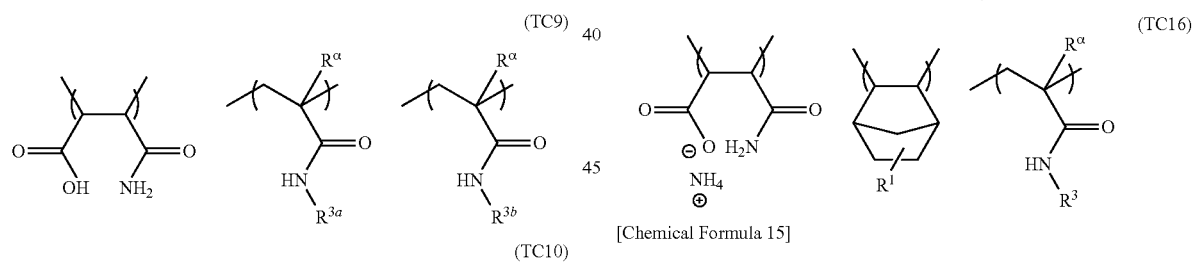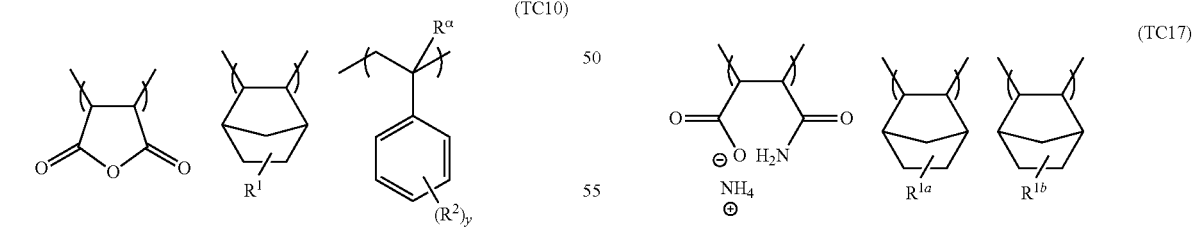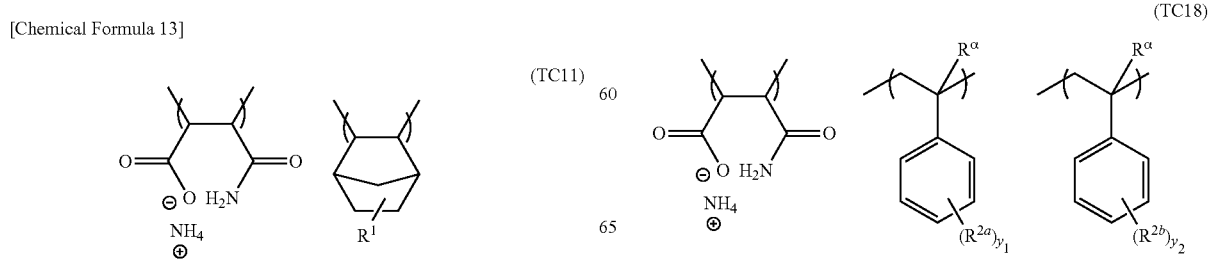

-continued (TC19)

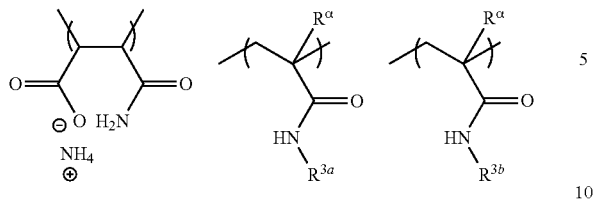

The weight average molecular weight (Mw) (the polystyrene equivalent value determined by gel permeation chromatography) of the polymeric compound used for the top coat material (2) is not particularly limited, but is preferably 1,000 to 50,000, more preferably 1,500 to 30,000, and most preferably 2,000 to 30,000. By ensuring the aforementioned range, solubility in an organic solvent can be increased.

Further, the dispersity (Mw/Mn) of the polymeric compound is not particularly limited, but is preferably 1.0 to 6.0, more preferably 1.0 to 5.0, and most preferably 1.0 to 4.0.

The polymeric compound can be obtained, for example, by a conventional radical polymerization or the like of the monomers corresponding with each of the structural units, using a radical polymerization initiator such as azobisisobutyronitrile (AIBN) or dimethyl 2,2'-azobis(isobutyrate).

In the topcoat material (2), the amount of the polymeric compound can be appropriately adjusted depending on the thickness of the topcoat film to be formed, and the like. In the topcoat material (2), the concentration of the polymeric compound is preferably 0.1 to 15% by weight, and more preferably 0.2 to 7% by weight.

(Surface energy control agent) A top coat material (1) may contain a surface energy control agent that controls a surface energy of the layer containing a block copolymer explained in <<method of producing structure containing phase-separated structure>>, as well as the polymeric compound containing the structural unit (Tc1).

By including the surface energy control agent, the surface energy of the layer containing the block copolymer can be controlled in an appropriate level during the phase separation.

Examples of the surface energy control agent include a component (i.e., cross-linking agent) that form an intermolecular chemical bond of the polymeric compounds or an intramolecular chemical bond of the polymeric compound in the top coat material by heating.

Specific examples of the surface energy control agent include cross-linking agents such as diamines, triamines and the like. Among these, diamines or triamines is preferably used, and diamines is particularly preferably used.

As amines, ammonia, trimethylamine, N,N-dimethylethylamine, N-ethyl-N-methylethylamine, triethylamine, pyridine, 1-methylpiperidine, tripropylamine may be employed.

Preferred examples of the surface energy control agents are shown below.

[Chemical Formula 16]

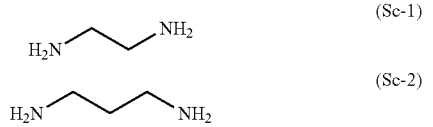
(Sc-1)

(Sc-2)

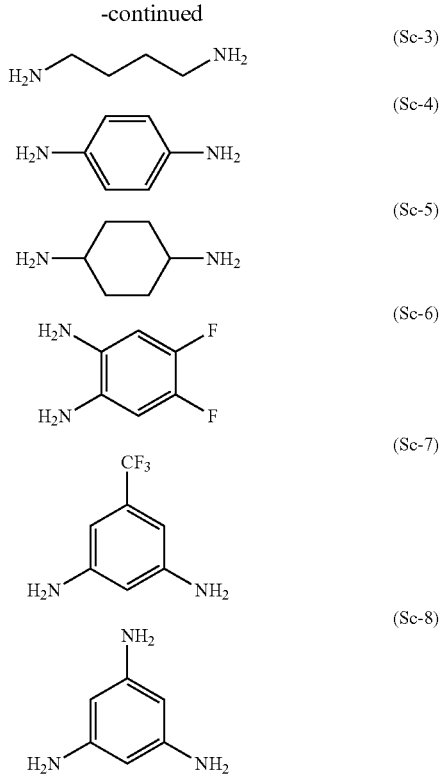

In the top coat material (1), as the surface energy control agent, one type of surface energy control agent may be used alone, or two or more types of surface energy control agents may be used in combination.

In the top coat material (1), the amount of the surface energy control agent relative to 100 parts by weight of the polymeric compound is preferably 2 to 500 parts by weight, and more preferably 5 to 300 parts by weight.

When the amount of the surface energy control agent is at least as large as the lower limit of the above-mentioned range, the surface energy of the layer containing the block copolymer can be easily controlled. On the other hand, when the amount of the surface energy control agent is no more than the upper limit of the above-mentioned range, the film formability becomes excellent.

[A Step in which Layer Containing Block Copolymer Having Top Coat Film Formed Thereon is Subjected to Annealing Treatment to Conduct Phase Separation of Layer]

In the phase separation step, the layer 2 including a block copolymer having the top coat film 3 formed thereon is subjected to heat annealing treatment so as to conduct a phase separation of the layer (FIG. 1(d)).

In the heat annealing treatment, the substrate having the layer containing the block copolymer formed thereon is subjected to a heat treatment. The heat treatment is preferably conducted at a temperature at least as high as the glass transition temperature of the block copolymer used and lower than the heat decomposition temperature. In the present embodiment, the heat temperature is preferably 100 to 300° C., and more preferably 120 to 280° C. The eating time is preferably 0.5 to 1440 minutes, and more preferably 1 to 600 minutes. Further, the heat treatment is preferably conducted in a low-reactive gas such as nitrogen.

The layer containing a block copolymer is subjected to a heat annealing treatment, so as to cause a phase separation of the layer containing a block copolymer (2a and 2b in FIG.

1(d)). As a result, a structure having a phase-separated structure formed on the surface of the substrate (preferably a lamellar phase-separated structure or a cylinder phase-separated structure arranged in a perpendicular direction of the surface of the substrate) can be provided.

[Neutralization Film Forming Step]

In the present invention, it is preferable that, before the [Step in which layer containing block copolymer is formed], a [neutralization film forming step] in which a neutralization film (not shown) containing a surface treatment agent is formed on a substrate (i.e., a substrate is subjected to neutralization treatment) is employed.

A neutralization treatment is a treatment in which the surface of the substrate is modified so as to have affinity for any blocks constituting the block copolymer. By the neutralization treatment, it becomes possible to prevent only phases of specific blocks to come into contact with the surface of the substrate by phase separation. In view this point, in order to form a phase-separated structure (preferably a lamellar phase-separated structure or a cylinder phase-separated structure arranged in a perpendicular direction of the surface of the substrate) on the surface of a substrate by a phase separation, it is preferable that a neutralization film depending on the type of the block copolymer used is formed on the surface of the substrate, before a layer containing the block copolymer is formed.

Specifically, a thin film (neutralization film) which has affinity for any blocks constituting the block copolymer and contains a surface treatment agent is formed on the surface of a substrate 1. The neutralization film may be formed by applying a surface treatment agent on a substrate.

Before a neutralization film is formed on a substrate 1, the surface of the substrate 1 may be washed. By washing the surface of the substrate 1, the formation of a neutralization film may be satisfactorily performed.

As the washing method, a conventional method may be used, and examples thereof include an oxygen plasma treatment, a hydrogen plasma treatment, an ozone oxidation treatment, an acid alkali treatment, and a chemical modification treatment. For example, the substrate is immersed in an acidic solution such as a sulfuric acid/hydrogen peroxide aqueous solution, followed by washing with water and drying.

The neutralization film may be formed using a resin composition as a surface treatment agent.

The resin composition can be appropriately selected from conventional resin compositions used for forming a thin film, depending on the type of blocks constituting the block copolymer.

The resin composition used as the surface treatment agent may be a heat-polymerizable resin composition, or a photosensitive resin composition such as a positive resist composition or a negative resist composition. Furthermore, a compound may be used as a surface treatment agent, and a non-polymerized film formed by applying the compound may be used as a neutralization film. For example, a siloxane organic monomolecular film formed from phenethyltrichlorosilane, octadecyltrichlorosilane or hexamethyldisilazane as a surface treatment agent may be preferably used as a neutralization film.

As such a surface treatment agent, a resin composition that contains the same structural units as those of blocks constituting a block copolymer, a resin composition that contains a structural unit having high affinity for the structural unit of block constituting a block copolymer, and a resin composition that has approximate average polarity of the all blocks constituting a block copolymer can be mentioned.

When a block copolymer containing a block of styrene as well as a block of the structural unit (a00-1) or (a00-2) is used, a resin component that contains a resin having a methyl methacrylate as a structural unit, or a compound or composition that has portion having high affinity for styrene structure and portion having high affinity for the structural unit (a00-1) or (a00-2) is preferably used as a surface treatment agent.

As the portion having high affinity for methyl methacrylate, a monomer having a functional group with high polarity such as a monomer having a trimethoxysilyl group, a trichlorosilyl group, a carboxy group, a hydroxy group, a cyano group or a hydroxyalkyl group in which part of the hydrogen atoms of the alkyl group has been substituted with a hydroxy group can be mentioned.

<<Forming Method of Top Coat Film>>

A second aspect of the present invention is a method of forming a top coat film, including: a step in which a layer containing a block copolymer is formed on a substrate; and a step in which a top coat material is applied to the layer containing the block copolymer to form a top coat film; wherein the top coat material contains an organic solvent component (S) and a polymeric compound containing a structural unit having either a dicarboxylic acid or a salt of a dicarboxylic acid, and the organic solvent component (S) contains water and an alcohol having 3 or more carbon atoms.

The explanations of [Step in which layer containing block copolymer is formed on substrate], [Step in which top coat material is applied to layer containing block copolymer to form top coat film] and top coat material are the same as described above.

The top coat material used in the method of a producing a phase-separated structure and in the method of forming a top coat film of the present invention exhibits excellent film formability. The reason is presumed as follows.

In the present invention, an alcohol having 3 or more carbon atoms is used as an organic solvent component of a top coat material. The hydrocarbon group of the alcohol having 3 or more carbon atoms is larger than that of the alcohol having 2 or less carbon atoms. Therefore, the alcohol having 3 or more carbon atoms exhibits lower polarity as compared to the alcohol having 2 or less carbon atoms. As the polarity is lower, the surface tension becomes lower. Therefore, it is presumed that, when the top coat material is applied to the surface of the block copolymer, the top coat material is less likely to be repelled, and film formability becomes excellent.

<<Optional Step>>

Figure 2:
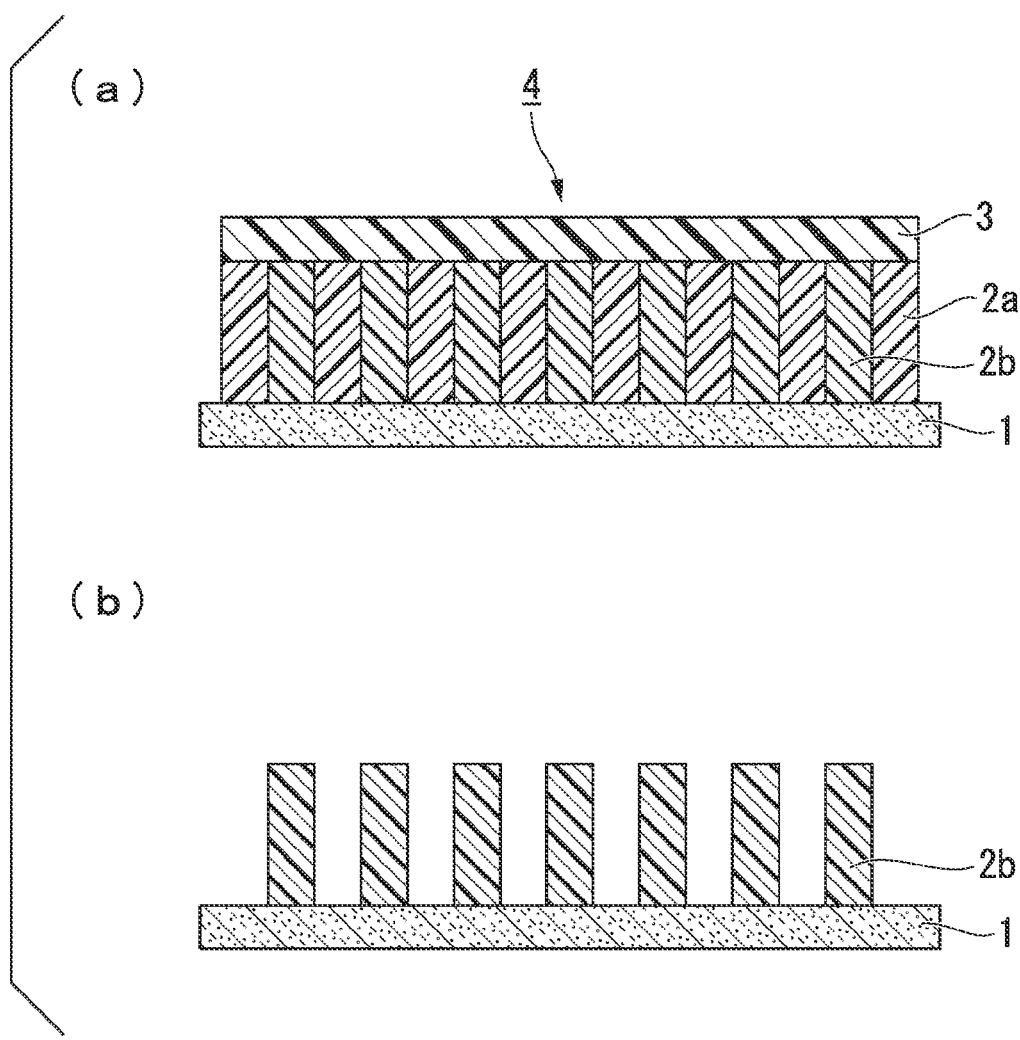
FIG. 2 is a schematic diagram showing an example of one embodiment of the present invention.

As a method of forming a pattern, a step in which a phase comprising at least one block is selectively removed from a structure containing a phase-separated structure to form a pattern can be employed, wherein the structure is produced by a method of the first aspect of the present invention. Specifically, as shown in FIG. 2, a top coat film 3 and a phase 2a are selectively removed from a structure 4 ((a) in FIG. 2) by an etching method to form a pattern on a substrate 1 ((b) in FIG. 2).

EXAMPLES

As follows is a description of examples of the present invention, although the scope of the present invention is by no way limited by these examples.

As a neutralization film, a neutralization film composition shown below adjusted to a concentration within the range of 0.5 to 1.0% by weight using PGMEA was applied to a silicon substrate using a spinner, and the composition was then baked and dried at 230° C. for 1 minute, thereby forming a layer composed of the neutralization film having a film thickness of 5 nm on the substrate.

A PGMEA solution containing 1.5% by weight of a block copolymer (BCP) shown below in terms of a solid content and propylene glycol monomethyl ether acetate (PGMEA) was spin-coated (number of revolution: 1500 rpm, 60 seconds) on the neutralization film under the condition in which a film having a thickness of 15 nm can be formed, and then bake treatment was conducted at 110° C. for 60 seconds, thereby forming a BCP layer having a film thickness of 15 nm.

To the BCP layer, a solution of a polymeric compound as a top coat material (TC material) (TC-B shown below) dissolved in a mixed solvent indicated in Table 1 (Examples 1 to 5, Comparative Example 1 to 6) having a solid content indicated in Table 1 was applied, thereby forming a top coat film having a thickness of 50 nm. Then, film formability of the top coat film was evaluated. The evaluation results of film formability are shown in Table 1.

[Chemical Formula 17]

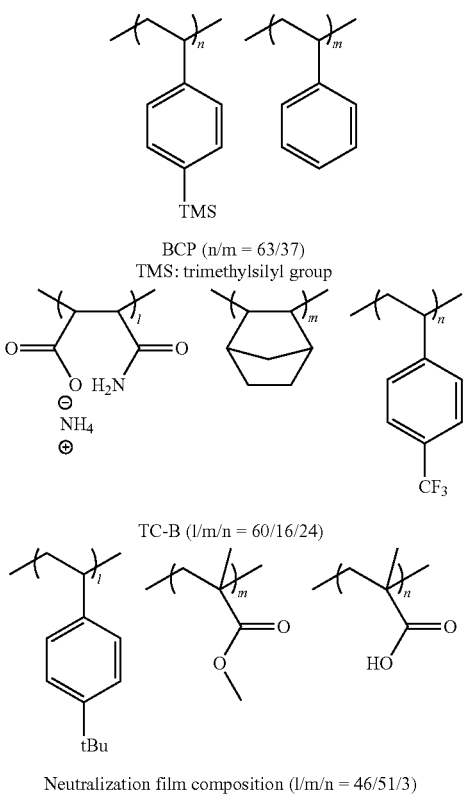

TABLE 1

| | Solvent used | Solid content (wt %) | Evaluation results of film formability |
|---|---|---|---|
| Example 1 | Water:IPA = 3:1 | 1.5 | Film could be formed |
| Example 2 | Water:IPA = 1:3 | 1.5 | Film could be formed |
| Example 3 | Water:IPA = 1:3 | 1.5 | Film could be formed |
| Example 4 | Water:IPA = 1:3 | 2.0 | Film could be formed |
| Example 5 | Water:IPA = 1:1 | 2.5 | Film could be formed |
| Comparative Example 1 | Water:MeOH = 1:3 | 1.5 | Film could not be formed |
| Comparative Example 2 | Water:MeOH = 1:3 | 2.0 | Film could not be formed |
| Comparative Example 3 | Water:MeOH = 1:3 | 2.5 | Film could not be formed |
| Comparative Example 4 | Water | 1.5 | Film could not be formed |
| Comparative Example 5 | MeOH | 1.5 | Film could not be formed |
| Comparative Example 6 | IPA | 1.5 | Film could not be formed |

In Table 1, the reference characters indicate the following. Further, the mixing ratio is the ratio by weight.
IPA: isopropyl alcohol
MeOH: methanol As shown in Table 1, a solution of a polymeric compound as a top coat material dissolved in a solvent containing an alcohol having 3 or more carbon atoms exhibited excellent film formability.

DESCRIPTION OF REFERENCE NUMERALS AND CHARACTERS

1: substrate, 2: layer, 3: top coat film, 4: structure

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of producing a structure containing a phase-separated structure, comprising:
    forming a layer containing a block copolymer on a substrate;
    applying a top coat material to the layer containing the block copolymer to form a top coat film; and
    subjecting the layer containing the block copolymer having the top coat film formed thereon to annealing treatment to conduct a phase separation of the layer,
    wherein the top coat material comprises an organic solvent component (S) and a polymeric compound containing a structural unit containing either a dicarboxylic acid or a salt of a dicarboxylic acid, and
    the organic solvent component (S) comprises water and an alcohol having 3 or more carbon atoms.

2. The method according to claim 1, wherein the alcohol having 3 or more carbon atoms is at least one solvent selected from the group consisting of isopropyl alcohol, propylene glycol monom ethyl ether, 3-methoxy-1-propanol, 3-methoxy-3-methylbutanol and t-butanol.

3. The method according to claim 1, wherein the alcohol having 3 or more carbon atoms is isopropyl alcohol.

4. The method according to claim 3, wherein the mixing ratio of isopropyl alcohol to water is in the range of 0.1 to 5.

5. The method according to claim 3, wherein the structural unit is represented by any one of chemical formulae (Tc1-1) to (Tc1-3) shown below;

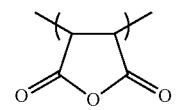 (Tc1-1)

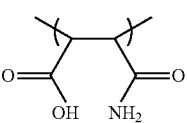 (Tc1-2)

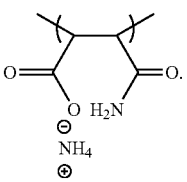 (Tc1-3)

6. The method according to claim 4, wherein the structural unit is represented by any one of chemical formulae (Tc1-1) to (Tc1-3) shown below;

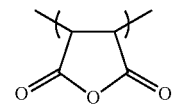 (Tc1-1)

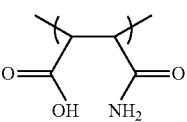 (Tc1-2)

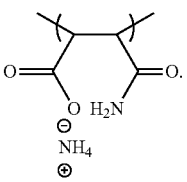 (Tc1-3)

7. The method according to claim 1, wherein the block copolymer contains an Si-containing block.

8. The method according to claim 4, wherein the block copolymer contains an Si-containing block.

9. The method according to claim 5, wherein the block copolymer contains an Si-containing block.

10. The method according to claim 6, wherein the block copolymer contains an Si-containing block.

11. A method of forming a top coat film, comprising:
forming a layer containing a block copolymer on a substrate; and
applying a top coat material to the layer containing the block copolymer to form a top coat film,
wherein the top coat material comprises an organic solvent component (S) and a polymeric compound containing a structural unit containing either a dicarboxylic acid or a salt of a dicarboxylic acid, and
the organic solvent component (S) comprises water and an alcohol having 3 or more carbon atoms.

12. The method according to claim 11, wherein the alcohol having 3 or more carbon atoms is at least one solvent selected from the group consisting of isopropyl alcohol, propylene glycol monomethyl ether, 3-methoxy-1-propanol, 3-methoxy-3-methylbutanol and t-butanol.

13. The method according to claim 11, wherein the alcohol having 3 or more carbon atoms is isopropyl alcohol.

14. The method according to claim 13, wherein the mixing ratio of isopropyl alcohol to water is in the range of 0.1 to 5.

15. The method according to claim 13, wherein the structural unit is represented by any one of chemical formulae (Tc1-1) to (Tc1-3) shown below;

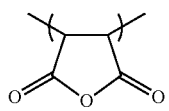 (Tc1-1)

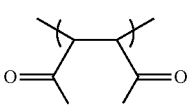 (Tc1-2)

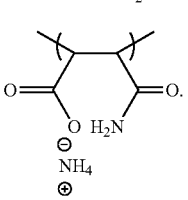 (Tc1-3)

16. The method according to claim 14, wherein the structural unit is represented by any one of chemical formulae (Tc1-1) to (Tc1-3) shown below;

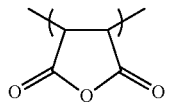 (Tc1-1)

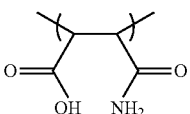 (Tc1-2)

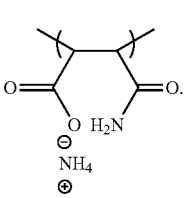 (Tc1-3)

17. The method according to claim 11, wherein the block copolymer contains an Si-containing block.

18. The method according to claim 14, wherein the block copolymer contains an Si-containing block.

19. The method according to claim 15, wherein the block copolymer contains an Si-containing block.

20. The method according to claim 16, wherein the block copolymer contains an Si-containing block.

* * * * *